US006836856B2

(12) United States Patent
Blanton

(10) Patent No.: US 6,836,856 B2
(45) Date of Patent: Dec. 28, 2004

(54) METHODS FOR CHARACTERIZING, GENERATING TEST SEQUENCES FOR, AND/OR SIMULATING INTEGRATED CIRCUIT FAULTS USING FAULT TUPLES AND RELATED SYSTEMS AND COMPUTER PROGRAM PRODUCTS

(75) Inventor: Ronald DeShawn Blanton, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 596 days.

(21) Appl. No.: 09/866,357

(22) Filed: May 25, 2001

(65) Prior Publication Data

US 2002/0178399 A1 Nov. 28, 2002

(51) Int. Cl.[7] ........................... G06F 11/00; G01R 31/28
(52) U.S. Cl. ........................................... 714/25; 714/37
(58) Field of Search ............................. 714/25, 37, 26, 714/27, 33, 30, 39, 47, 741, 742; 703/1–5

(56) References Cited

U.S. PATENT DOCUMENTS

| | | | |
|---|---|---|---|
| 5,305,328 A | * 4/1994 | Motohara et al. ............ | 714/741 |
| 5,475,624 A | * 12/1995 | West ............................. | 703/15 |
| 5,546,408 A | 8/1996 | Keller .......................... | 371/27 |
| 6,108,806 A | * 8/2000 | Abramovici et al. ........ | 714/725 |
| 2002/0093356 A1 | * 7/2002 | Williams et al. ............. | 324/765 |
| 2002/0178399 A1 | * 11/2002 | Blanton ........................ | 714/25 |
| 2003/0182638 A1 | * 9/2003 | Gupta et al. .................. | 716/4 |
| 2004/0064773 A1 | 4/2004 | Kundu et al. | |

OTHER PUBLICATIONS

K. Dwarakanath et al; *Universal Fault Simulation Using Fault Tuples*; Annual ACM IEEE Design Automation Conference; Proceedings of the 37th conference on Design automation; Jun. 5–9, 2000, Los Angeles, CA USA pp 786–789.

Rao Desineni et al; *Universal Test Generation Using Fault Tuples*; ITC International Test Conference (31st: 2000: Atlantic City, NJ) Proceedings International Test Conference 2000: Oct. 3–5, 200, New Atlantic City Convention Center, Atlantic City, NJ, USA; pp 812–819.

TestBench, Library Data Reference, Ninth Edition; Version 2000, IBM Corporation; Endicott, NY 13760; pp 170–181 and 177–183.

M. Abramovici et al; *Digital Systems Testing and Testable Designs*; IEEE Press; The Institute of Electrical and Electronics Engineers, Inc., New York; pp 292–294 and 197–199.

J. Khare et al; *Fault Characterization of Standard Cell Libraries Using Inductive Contamination Analysis (ICA)* 14th VLSI Test Symposium—1996 pp 405–413.

S. Gai et al; *MOZART: A Concurrent Multilevel Simulator*; IEEE Transactions on Computer Aided Design, vol. 7, No. 9, Sep. 1988; pp 1005–1016.

(List continued on next page.)

Primary Examiner—Nadeem Iqbal
(74) Attorney, Agent, or Firm—Myers Bigel Sibley & Sajovec

(57) ABSTRACT

A fault in an integrated circuit device can be characterized using fault tuples. In particular, an integrated circuit device can include primary inputs, primary outputs, and a plurality of signal lines and circuits interconnecting the primary inputs and outputs. A fault tuple is defined to include an identification of a signal line, a signal line value, and a clock cycle constraint for the signal line. A fault tuple is satisfied by providing a test sequence comprising one or more test patterns such that the signal line is controlled to the signal line value during a clock cycle of the test sequence defined by the clock cycle constraint responsive to application of the test sequence to the primary inputs. Fault tuples can be used to generate and simulate test sequences.

62 Claims, 5 Drawing Sheets

OTHER PUBLICATIONS

Scott Davidson; *ITC '99 Benchmark Circuits—Preliminary Results*; Sun Microsystems, Inc., ITC International Test Conference; Paper P6.0 (1125), 1999.

S. Ma et al; *An Experimental Chip to Evaluate Test Techniques Experiment Results*; Center for Reliable Computing; International Test Conference; Paper 28.3 (663–672), 1995.

J. Paul Roth; *Diagnosis of Automata Failures: A Calculus and a Method*; IBM Journal, Jul. 1966, pp 278–291.

F. Brglez; *Accelerated ATPG and Fault Grading Via Testability Analysis*; Proceedings of ISCAS 1985 IEEE pp 695–698..

G. Smith; *Model for Delay Faults Based Upon Paths*; 1985 International Test Conference; Paper 9.6 (342–349).

K, Butler; *The Stuck–at Fault: It Ain't Over Til It's Over*; International Test Conference; Paper P10.1 (1165), 1998, IEEE.

Y. Gong et al; *Locating Bridging Faults Using Dynamically Computed Stuck–At Fault Dictionaries*; IEEE Transactions on Computer–Aided Design of Integrated Circuits and Systems, vol. 17, No. 9, Sep. 1998; pp 876–887.

M. Gharaybeh et al; *Classification and Test Generation for Path–Delay Faults Using Single Stuck–Fault Tests*; International Test Conference; Paper 5.4 (139–148), IEEE, 1995.

J. Patel; *Stuck–at Fault: A Fault Model for the Next Millenium*; University of Illinois at Urbana–Champaign; International Test Conference; Paper P10.2 (1166), IEEE, 1998.

W. Chen et al; *Test Generation in VLSI Circuits for Crosstalk Noise*; Department of Electrical Engineering–Systems; International Test Conference; Paper 25.3 (641–650).

K. Lee et al; *Test Generation for Crosstalk Effects in VLSI Circuits*; IEEE (1996) pp 628–631.

W. Kautz; *Testing for Faults in Combinatorial Cellular Logic Arrays*; Stanford Research Institute; Proceedings of the 8$^{th}$ Symposium on Switching Automation Theory, pp 161–174, 1967.

H. Al–Asaad et al; *ESIM: A Multimodel Design Error and Fault Simulator for Logic Circuits; IEEE* (Apr. 2000), Proceedings of the 18$^{th}$ VLSI Test Symposium, pp 221–228.

J. Roth et al; *Programmed Algorithms to Compute Tests to Detect and Distinguish Between Failures in Logic Circuits*; IEEE Transactions on Electronic Computers, vol. EC–16, No. 5, Oct. 1967; pp 71–83.

H. Lee et al; *HOPE: An Efficient Parallel Fault Simulator for Synchronous Sequential Circuits*; IEEE Transactions on Computer–Aided Design of Integrated Circuits and Systems. vol., 15. No. 9, Sep. 1996; pp 1048–1058.

P. Banerjee et al; *Characterization and Testing of Physical Failures in MOS Logic Circuits*; IEEE Design & Test (Aug. 1984); pp 76–86.

R.D. Blanton et al; *Properties of the Input Pattern Fault Model*; IEEE 1997; pp 372–380.

P. Nigh et al; *An Experimental Study Comparing the Relative Effectiveness of Functional, Scan, IDDq and Delay–fault Testing*; IEEE 1997; pp 459–464.

F. Ferguson et al; *Extraction and Simulation of Realistic CMOS Faults using Inductive Fault Analysis*; 1988 International Test Conference; Paper 25.1; pp 475–484.

H. Lee; *Soprano: An Efficient Automatic Test Pattern Generator for Stuck–Open Faults in CMOS Combinational Circuits;* 27$^{th}$ ACM/IEEE Design Automation Conference; Paper 39.2; 1990; pp 660–666.

U. Mahlstedt et al; *Simulation of non–classical Faults on the Gate Level—The Fault Simulator COMSIM*; International Test Conference; pp 883–892, Oct. 1993.

Kenyon C.Y. Mei; *Bridging and Stuck–At–Faults*; IEEE Transactions on Computers, vol. C–23, No. 7, Jul. 1974; pp 42–49.

R.L. Wadsack; *Fault Modeling and Logic Simulation of CMOS and mos Integrated Circuits*; The Bell System Technical Journal, May–Jun. 1978 pp 1449–1473.

S. Ma et al; *An Experimental Chip to Evaluate Test Techniques Experiment Results*; International Test Conference; Paper 28.3, IEEE 1995 pp 663–672.

\* cited by examiner $\{<E,0,i><C,0,i><F,\bar{D},i>\}$ $\{<A,\bar{D},i>|<C,D,i>\}$ $\{<E,1,i><E,\bar{D},i+1>\}$ AND BF(B,C)
$\{<B,D,i><C,0,i>|<B,0,i><C,D,i>\}$ $\{<E,0,i><E,D,i+1>\}$

METHODS FOR CHARACTERIZING, GENERATING TEST SEQUENCES FOR, AND/OR SIMULATING INTEGRATED CIRCUIT FAULTS USING FAULT TUPLES AND RELATED SYSTEMS AND COMPUTER PROGRAM PRODUCTS

BACKGROUND OF THE INVENTION

The present invention relates to the field of integrated circuits, and more particularly to the fields of integrated circuit testing, fault generation, and/or test pattern generation.

Fault modeling techniques are discussed, for example, in U.S. Pat. No. 5,546,408 to Keller entitled "Hierarchical Pattern Faults For Describing Logic Circuit Failure Mechanisms", the disclosure of which is incorporated herein in its entirety by reference. In automatic test generation programs, some type of defect model is generally used to identify test stimulus patterns for detecting the modeled defects. The defect model is also used to ascertain the effectiveness of the generated test stimulus patterns in detecting the defects.

Traditionally a "stuck-at" fault model has been used in the test industry. That is, a defect is modeled as a node or pin that is shorted to (stuck-at) another node or pin, such as a logic one level or a logic zero level. More recently, a transition fault model has been used to model dynamic defects that require a sequence of two test stimulus patterns to excite the defect.

As discussed in the Keller '408 patent, a "pattern fault" is defined as a static pattern fault or as a dynamic pattern fault. A static pattern fault is represented as a list of required excitation nodes and their values, as well as a fault propagation point. The fault propagation point is defined to be a net or node in a circuit to be tested where the defect's effect first appears once it has been excited. A dynamic pattern fault adds to this structure an initial value list of nodes and their required initial values. The dynamic pattern fault may be employed when a two pattern sequence is required to excite a specific defect.

SUMMARY OF THE INVENTION

Integrated circuit faults can be characterized according to embodiments of the present invention using fault tuples. An integrated circuit device, for example, may include primary inputs, primary outputs, and a plurality of signal lines and circuits interconnecting the primary inputs and outputs. A fault tuple, according to embodiments of the present invention, can be defined to include an identification of a signal line, a signal line value, and a clock cycle constraint for the signal line. The fault tuple is satisfied by providing a test sequence comprising one or more test patterns such that the signal line is controlled to the signal line value during a clock cycle of the test sequence defined by the clock cycle constraint responsive to application of the test sequence to the primary inputs.

Fault tuples, products of fault tuples, and/or macrofaults of OR-ed products of fault tuples can be used to generated test patterns for integrated circuit devices. For example, at least one fault tuple can be provided including an identification of a signal line, a signal line value, and a clock cycle constraint for the signal line. A test sequence comprising at least one test pattern can be determined such that the test sequence can be applied to the primary inputs of the integrated circuit device to control the signal line to the signal line value during a clock cycle of the test sequence defined by the clock cycle constraint.

Fault tuples, products of fault tuples, and/or macrofaults of OR-ed products of fault tuples can also be used to simulate test patterns for faults of an integrated circuit device. For example, a fault tuple can be provided including an identification of a signal line, a signal line value, and a clock cycle constraint for the signal line. A test sequence comprising one or more test patterns can also be provided. Simulation according to embodiments of the present invention can determine if the fault tuple will be satisfied by the test pattern such that the signal line is controlled to the signal line value during a clock cycle of the test sequence defined by the clock cycle constraint responsive to application of the test sequence to the primary inputs.

DETAILED DESCRIPTION OF THE INVENTION

Figure 1:
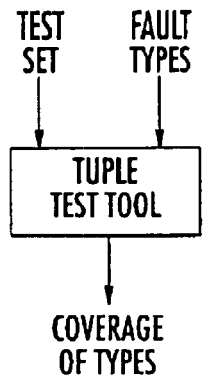
FIG. 1 is a block diagram of a fault simulator according to embodiments of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A fault representation mechanism for digital circuits according to the present invention is based on fault tuples. A fault tuple is a 3-element set including a signal line, a value, and a clock cycle constraint. AND-OR expressions of fault tuples are used to represent arbitrary misbehaviors. A fault simulator based on fault tuples has been used to conduct experiments on benchmark circuits, and simulation results show that a 17% reduction of average CPU time can be achieved when performing simulation on all fault types simultaneously, as opposed to individually. Further improvements in speedup may be obtained when the shared characteristics of the various fault types are better exploited.

The classical single stuck-line (SSL) fault model is the most commonly used fault model in digital systems testing.

The SSL fault model assumes that any single circuit line is susceptible to a permanent stuck-at logic value of 0 or 1. Among the many reasons for its continued appeal are: (a) the number of SSL faults is linearly related to the number of lines in the circuit, (b) the model maps well to the gate level, (c) the SSL tests have traditionally done a good job of detecting non-SSL misbehavior, and (d) there exist many commercial test generation and fault simulation tools based on single stuck-line misbehavior.

However, real defects may not behave like SSL faults, thus making tasks like defect diagnosis difficult, and SSL tests alone may not be sufficient for obtaining high defect coverage. For example, a defect can cause an unwanted short between two signal lines. Such a bridging fault, can be modeled as an unwanted AND gate in the circuit. This change in the circuit functionality may not be accurately modeled using SSL faults. As a result, other fault models have been explored. See, for example, P. Bannerjee, et al., "Characterization and Testing of Physical Failures in MOS Logic Circuits," IEEE Design & Test of Computers, Vol. 1, No. 3, pp 76–86, August 1984; R. D. Blanton, et al., "Properties of the Input Pattern Fault Model," In. Proc. of 1997 International Conference on Computer Design, pp 372–80, October 1997; K. C. Y. Mei, "Bridging and Stuck-At Faults," IEEE Transactions of Computers, Vol. 23, No. 7, pp 720–7, July 1974; G. L. Smith, "A Model for Delay Faults Based Upon Paths," In Proc. of 1985 International Test Conference, pp. 342–9, November 1985; and R. L. Wadsack, "Fault Modeling and Logic Simulation of CMOS And MOS Integrated Circuits," Bell System Technical Journal, Vol. 57, No. 5, pp 1449–74, May-June 1978. The disclosure of each of the above referenced publications is hereby incorporated by reference herein in its entirety.

In addition, approaches like inductive fault analysis specify a realistic fault set by investigating the physical defects that lead to a failure. See, for example, F. J. Furguson, et al., "Extraction and Simulation of Realistic CMOS Faults Using Inductive Fault Analysis," In. Proc. of 1998, International Test Conference, pp. 475–84, September. 1998; and J. Khare, et al., "From Contamination to Defects, Faults and Yield Loss; Simulations and Applications," Klumer, Norwell, Mass., 1996. The disclosure of each of these publications is hereby incorporated by reference herein in its entirety. Stuck-at tests may be augmented by tests that target other fault types (bridging, delay, etc.) to improve defect coverage. This trend of augmenting stuck-at tests with other types of tests may continue due to on-going changes in technology.

The fault-tuple fault modeling mechanism may allow many arbitrary misbehaviors to be represented using expressions of primitives called fault tuples. A fault tuple is a 3-element subfault including a signal line, a value, and a clock cycle constraint. AND-OR expressions of fault tuples, called macrofaults, can be used to represent various misbehaviors. The use of fault tuples allow both existing and emerging fault models to be represented using one common mechanism. Advantages of this common representation may among others, include (a) simultaneous analysis of different misbehaviors, (b) exploitation of common information among various misbehaviors, and/or (c) a single method for analyzing misbehaviors.

Due to the different misbehaviors exhibited by various fault types, a separate test tool may be conventionally constructed for each fault model. By using the fault tuple mechanism for representing fault types, a single comprehensive tool can be used to simultaneously perform fault simulation and test generation for many types of faults as illustrated in FIG. 1.

Figure 3A:
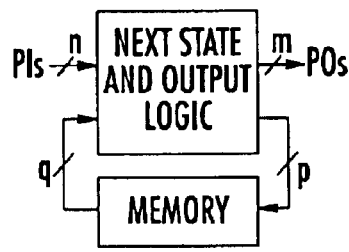
FIG. 3a is a block diagram of a Huffman sequential circuit model.
Figure 3B:
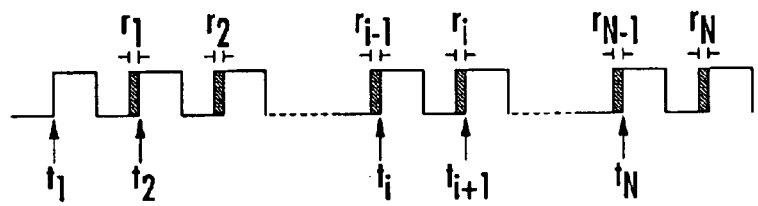
FIG. 3b is a timing diagram illustrating test pattern application times and output response observation time windows for a Huffman sequential circuit model.

FIG. 3($a$) illustrates the Huffman model used to represent a circuit under test. Test patterns are applied to the primary inputs (PIs) on the rising edge of the clock cycle at $t_1, t_2, \ldots t_N$. Circuit responses to the test patterns are observed at the end of a clock cycle at the primary outputs (POs) during the time windows $r_1, r_2, \ldots, r_N$ shown in FIG. 3($b$).

As discussed above, a fault tuple is a three tuple f=<l,v,t>, where l is any signal line in the circuit under test, v=g/e ∈ {0/0, 0/1, 1/1, 1/0}, and t is a constraint that describes the clock cycle(s) for which g ∈ v must be applied to l. (Using the well-known D algebra the values of v can be represented as: 0=0/0, 1=1/1, D-1/0, $\overline{D}$=0/1.) The fault tuple element t can take any of the following values {N, i, i+N, <i, >i, ≧i, ≦i, >i+N, etc.}, where:

N: Nth clock cycle after $t_1$, i.e., the $t_N$ clock cycle;

i: Any clock cycle $t_i$;

i+N: Nth clock cycle after a reference clock cycle $t_i$ i.e., $t_{i+N}$;

>i: Any clock cycle $t_j$ after a reference clock cycle $t_i$ (j>i);

<i: Any clock cycle $t_j$ before a reference clock cycle $t_i$ (j<i);

≧i: The clock cycle $t_i$ or any clock cycle $t_j$ after $t_i$ (j≧i);

≦i: The clock cycle $t_i$ or any cycle $t_j$ before $t_i$ (j≦i); and

>i+N: Any clock cycle $t_j$ after the Nth clock cycle after a reference clock cycle $t_i$ (j>i+N).

Other clock cycle constraints can be defined in a similar fashion.

Figure 4:
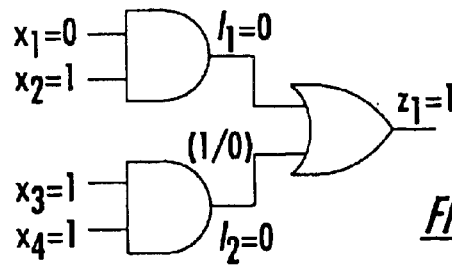
FIG. 4 is a schematic diagram illustrating a circuit and a test input pattern.

A fault tuple f=<l,v,t> is satisfied if g ∈ v is applied to signal line l for the clock cycle range described by t due to the application of a sequence of test patterns $T_1, T_2, \ldots T_n$ from an unknown or reset state. Consider the circuit shown in FIG. 4 and the fault tuples $f_1$=<$x_1$, 0, i> and $f_2$=<$l_2$, D, i>. Fault tuple $f_1$ is satisfied if a test pattern sequence assigns the value 0 to signal line $x_1$ in any clock cycle (clock cycle constraint t=i). Since the example circuit is combinational, the single test pattern $x_1x_2x_3x_4$=0111 applies the value 0 to $x_1$. Thus, the fault tuple $f_1$ is satisfied by $x_1x_2x_3x_4$=0111. The satisfaction of $f_2$ requires that a 1 be applied to signal line $l_2$ in any clock cycle. The test $x_1x_2x_3x_4$=0111 also causes the value 1 to be applied to signal line $l_2$ and, therefore, also satisfies fault tuple $f_2$. The value D=1/0 in parenthesis on $l_2$, in FIG. 4, is the. discrepancy or error activated on the line. The observation requirements of the error are discussed below.

A fault tuple f=<l,v,t> is a reference tuple if no relational or arithmetic operators appear in the clock cycle constraint t. Two fault tuples $f_i$=<$l_i,v_i,t_i$> and $f_j$=<$l_j,V_j,t_j$> are related if both $f_i$ and $f_j$ use the same clock cycle variable i to describe their clock cycle constraints. Two fault tuples $f_i$=<$l_i,v_i,t_i$> and $f_j$=<$l_j,v_j,t_j$> are distinct if $l_i$≠$l_j$ or $v_i$≠$v_j$ or $t_i$≠$t_j$. Distinct fault tuples $f_i$ and $f_j$ are represented as $f_i$≠$F_j$. The fault tuples $f_1$=<$l_1$,1,i>, $f_2$=<$l_2$,1,j> and $f_3$=<$l_3$,D,j+1> are distinct. Fault tuples $f_1$ and $f_2$ are reference tuples since the clock cycle constraints for both these tuples contain no relational or arithmetic operators. The fault tuples $f_2$ and $f_3$ are related because both use the same clock cycle variable j, while $f_1$ is not related to either $f_2$ or $f_3$ because it uses the clock cycle variable i.

A subproduct S=$f_1 \cdot f_2 \ldots f_n$ is a conjunction of fault tuples where all the fault tuples of S are related; at least one fault tuple $f_i$∈S is a reference fault tuple or all the fault tuples of the subproduct have integer clock cycle constraints; and every pair of fault tuples $f_i$, $f_j$∈S are distinct, such that $f_i$≠$f_j$ for every i,j pair where i≠j. A subproduct S=$f_1f_2 \ldots f_n$ is satisfied if all the fault tuples of the subproduct are satisfied and at least one error D or $\overline{D}$ (if any) is observed in any clock cycle in or after the clock cycle in which the error was activated due to the application of a sequence of test patterns $T_1, T_2, \ldots T_n$. Two subproducts $S_i=f_{i1}f_{i2} \ldots f_{im}$ and $S_j=f_{j1}, f_{j2} \ldots f_{jn}$ are distinct if $|S_i| \neq |S_j|$ or $f_{ip} \neq f_{iq}$, for any $f_{ip} \in S_i$ and $f_{iq} \in S_j$. Distinct subproducts $S_i$ and $S_j$ are denoted as $S_i \neq S_j$.

Fault tuples represent conditions for a signal line's value and the clock cycle constraint when the value is applied on the signal line. Related fault tuples together represent the activation conditions for a single faulty circuit or faulty machine. Hence, each subproduct represents some or all the activation and observation conditions for a unique faulty machine.

Consider the distinct subproducts $S_1=<l_1,0,i><l_2,D,i>$, $S_2=<l_1,1,j><l_2,D,j+1><l_3,l,>=j+3>$ and $S_3=<l_1,0,i+1><l_2,D,i+1>$. Both the subproducts $S_1$, $S_2$ have at least one reference tuple each ($<l_1,0,i>$ or $<l_2,D,i>$ for $S_1$ and $<l_1,l,j>$ for $S_2$) and are formed of distinct and related fault tuples. Subproduct $S_3$ is an illegal subproduct because it does not contain a reference tuple.

Satisfaction of $S_1$ requires the two faults tuples of $S_1$ to be satisfied at the same clock cycle $t_i$. Since fault tuple $f_{12}=<l_2,D,i>$ of subproduct $S_1$ has an error D, this error needs to be observed to satisfy $S_1$. If the circuit under test is combinational, satisfaction of $S_1$ would require D to be observed in the output response observation time window $r_i$. If the circuit under test is sequential, satisfaction of $S_1$ would require D to be observed in output response observation time window $r_j$, such that $j \geq i$, since the error D could take more than one clock cycle to be observed. Hence, the test sequence length for the satisfaction of this subproduct could be one or more tests.

Subproduct $S_2$ contains fault tuples with clock cycle constraints with relational or arithmetic operators. Satisfaction of $S_2$ requires that all the fault tuples of $S_2$ be satisfied. The $f_{21}=<l_i,l,j>$ fault tuple has to be satisfied at any clock cycle $t_j$. Fault tuples $f_{22}=<l_2,D,j+1>$ has to be satisfied in the subsequent clock cycle $t_{j+1}$ as required by the fault tuple's clock cycle constraint. Fault tuple $f_{23}=<l_3,l,>=j+3>$ has to be satisfied in the third clock cycle after $t_j$, i.e., $t_{j+3}$ or any clock cycle $t_k$ such that $k>=j$. Finally, for the satisfaction of $S_2$ the error D due to $f_{22}$ has to be observed in some output response observation window $r_s$ such that $s \geq j+1$.

A product $P=S_1.S_2 \ldots S_m$ is a conjunction of subproducts such that every pair of subproducts $S_i,S_j \in P$, are distinct, that is, $S_i \neq S_j$ for every i,j pair such that $i \neq j$. A product $P=S_1.S_2 \ldots S_m$ is satisfied if and only if each subproduct of $S_i \in P$ is satisfied by the same test sequence. A macrofault $M=\{P_1+P_2+ \ldots P_n\}$ is a disjunction of products. A macrofault $M=\{P_1+P_2+ \ldots P_n\}$ is detected if and only if at least one $P_1 \in M$ is satisfied.

A product potentially represents the conditions for activation and observation of multiple faulty machines using the same test sequence $T_{seq}$. Each subproduct of a product represents one of these multiple faulty machines. Since each subproduct can have fault tuples with various clock cycle constraints, the test sequence lengths for each subproduct satisfaction can be different. The longest test sequence among these various sequences should be capable of satisfying all the subproducts of the product. The sequence $T_{seq}$ refers to such a sequence.

A macrofault represents alternative activation and observation conditions for one or more defects. Each product (which is not necessarily mutually exclusive from other products) of a macrofault is used to represent an alternative activation and observation condition for one or more faulty misbehaviors caused by the corresponding defects.

Consider the product $P_1=<l_1,0,i><l_2,D,i><l_3,l,j>l_4,D,j+1>$ formed of two distinct subproducts $S_1=<l_1,0,i><l_2,D,i>$ and $S_2=<l_3,l,j><l_4,D,j+1>$. Both these subproducts need to be satisfied by the same test sequence to satisfy $P_1$. Consider the macrofaults $M_1=\{<l_1,D,i>+<l_2,0,i>\}$, $M_2=\{<l_1,0,i>+<l_2,D,i+1>\}$ and $M_3=\{<l_1,D,i><l_2,D,i+1>\}$. Macrofault $M_1$ is legal and is formed of two products $P_1=<l_1,D,i>$ and $P_2=<l_2,0,i>$, each containing a single subproduct. The products $P_1$ and $P_2$ represent alternative activation and observation conditions for the detection of the defect represented by $M_1$. Although macrofault $M_1$ contains two different products, the use of the same clock cycle variable i in the fault tuples of both the products means that the products together represent one single faulty machine. Macrofault $M_2$ is formed of two products $P_1=<l_1,0,i>$ and $P_2=<l_2,D,i+1>$, each containing a single subproduct. This macrofault is illegal, even though the fault tuples of the two products are related, because the product $P_2$ contains no reference tuple.

Macrofault $M_3$ is a legal macrofault but probably does not exactly convey what the user intended. Detection of $M_3$ requires that fault tuples $f_{31}=<l_1,D,i>$ and $f_{32}=<l_2,D,i+1>$ be satisfied in adjacent clock cycles, and an error be observed. The use of the fault tuple $f_{32}$ is most likely a user-provided insight for error propagation of the D of $f_{31}$ in subsequent clock cycles if observation of the error does not happen in the clock cycle in which $f_{31}$ is satisfied. Consider the case where the fault tuple $f_{31}$ is satisfied and its error D is observed in the same clock cycle in which satisfaction occurs. In this case the satisfaction of $f_{32}$ for the detection of macrofault $M_3$ is unnecessary and not required. But the definition of $M_3$ requires the satisfaction of $f_{31}$ (note however that the observation of the error of $f_{31}$ is not required). Hence, a better representation of the user's intention is most likely $M_3=\{<l_1,D,i>+<l_1,D,i><l_2,D,i+1>\}$. For this macrofault, if the single product containing the single fault tuple $<l_1,D,i>$ is satisfied and its error observed, there will be no need to consider the second product.

A fault tuple is a fault modeling mechanism that allows for the representation of a significant number of fault types. Consider an SSL fault $f=\alpha/1$ (i.e. signal line a is permanently stuck-at 1). This can be represented using the tuple format as: $\{<\alpha, \overline{D},i>\}$, which indicates that fault f is detected if in any clock cycle i, a value 0 is applied to line $\alpha$ and the error discrepancy $\overline{D}$ due to f is propagated to an observable point. These are the conditions for detecting the SSL fault f. Other fault types can also be represented.

Figure 2C:
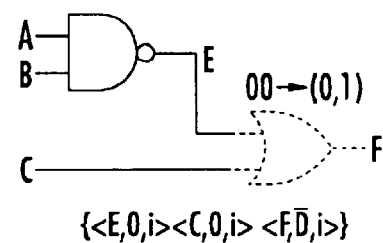
FIGS. 2a–2f are schematic diagrams illustrating fault types described using fault tuples according to embodiments of the present invention.
Figure 2A:
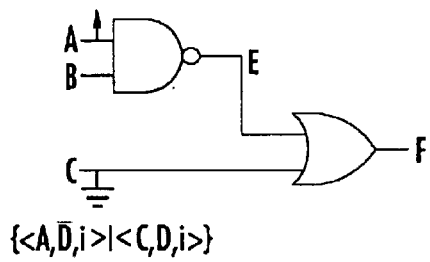
Figure 2D:
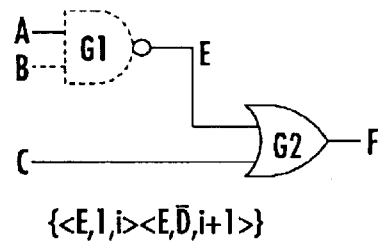
Figure 2B:
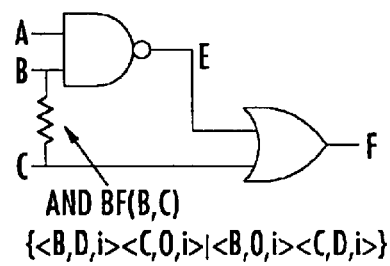

FIGS. 2a, 2b and 2c illustrate how the tuple mechanism can be used to represent a multiple stuck-line (MSL) fault (A/1, C/0), an AND-bridging fault between lines B and C, and an OR gate pattern fault, respectively. The MSL and AND-bridging faults can be detected in multiple ways as indicated by the disjunction of the tuple product expressions.

For example, the MSL fault $M=\{A/1, C/0\}$ is detected if and only if the faulty circuits with both SSL faults A/1 and C/0 are detected, or A=1 and C/0 are detected, or A/1 is detected and C=0. The conditions for the detection of M can be represented using tuple expressions in FIG. 2a. The AND bridging fault F=ANDBF(B,C) is detected if and only if the SSL fault B/0 is detected AND C=0 OR the SSL fault C/0 is detected AND B=0. See Abromovici et al., "Digital Systems Testing And Testable Design," Piscataway, N.J., IEEE Press, 1990 the disclosure of which is here by incorporated by reference herein in its entirety. The condition for the detection of F can be represented using tuple expressions in FIG. 2b. The pattern fault P=00→(0, 1) of the OR gate is detected if E=0 AND C=0 (activation conditions for P) AND the discrepancy $\overline{D}$ caused at the output of the OR gate is propagated to an observable point. The tuple expression for the conditions of P's detection is shown in FIG. 2c. The use of the same clock cycle variable t=i for the MSL and bridging faults indicates that the tuples are not independent, that is, all the tuples of a product have to be satisfied in the same clock cycle i.

Transistor stuck-open (TSO) faults can also be represented using the tuple representation mechanism as shown in FIG. 2d where the N-transistor of gate G1 connected to line B is stuck-open. The macrofault representation of a TSO fault is based on the 2-test sequence required for detecting a TSO fault for CMOS circuits. This macrofault is also an example of a macrofault utilizing a relational value for t. For the example shown, the pull-down transistor to which input B is connected is considered to be stuck-open. To detect this fault, the output of the NAND gate (line E) can be initialized to a logic value '1' using the first test pattern. The second test pattern is then used to activate the faulty transistor and propagate the error discrepancy $\bar{D}$ to an observable point. This sequence of two test patterns is captured by the time element values i and i+1. Tuple(s) with t=i describe the initialization condition for the fault. The tuples with t=i+1 describe conditions for the activation and propagation of the error discrepancy $\bar{D}$ to an observable point exactly 1 clock cycle after the conditions have been initialized in clock cycle i. Similarly, conditions for TSO fault detection can be described for the other faulty transistors of the NAND gate and for other gate types also.

Figure 2E:
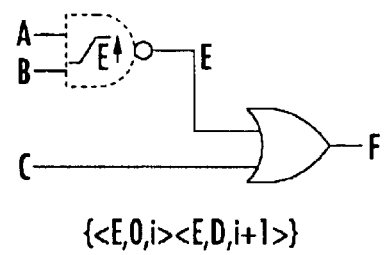
Figure 2F:
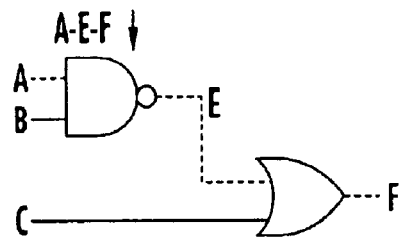

Timing or dynamic faults can also be captured by the tuple mechanism. FIGS. 2e and 2f illustrate a slow to rise NAND gate transition fault E and slow-to-fall robust path delay fault AEF, respectively. These macrofaults use relational values, like the TSO fault of FIG. 2d, for the tuple element t. The slow-to-rise NAND gate transition fault (FIG. 2e) is detected if the transition is initialized (E=0) by first test vector and the slow transition represented by the error discrepancy D appearing on line E is propagated to an observable point by the second test vector. This sequence of test vectors is captured by the time values I and I+1. Path delay faults can also be described using the same mechanism with additional conditions for values on the side inputs along the path under test.

From the expressions for the macrofaults, it can be observed that tuple sharing exists among various fault types. In other words, many fault types can be described using common fault tuples. For example the tuple <C, D, i>is present in the expression for the MSL and the AND-BF macrofaults of FIGS. 2a and 2b. Tuple sharing can be exploited by tracking the corresponding macrofaults when tuples are analyzed (simulated).

High defect coverage relies on good coverage of different fault types. Comprehensive test generation techniques according to the present invention can be used to generate tests for many arbitrary misbehaviors that can occur in digital systems, thus providing a single test generation solution. The techniques according to the present invention are based on the fault tuple modeling mechanism which can be used to represent many misbehaviors in terms of 3-element primitives.

Experimental results show the viability of the methodology for generating tests for various fault types. It is also shown that common information among various fault types can be exploited to reduce the total test generation time, test set size, and the number of aborted faults. Results generated from benchmark circuits can produce a reduction in CPU run times for test generation by an average of 32% when compared to the sum of CPU run times for each individual fault type. A significant reduction in the test set sizes and number of aborted faults can also be achieved. Simultaneous analysis for various fault types can result in an average test set compaction of 60% and a 34% reduction in a number of aborted faults.

As will be appreciated by one of skill in the art, the present invention may be embodied as a method, data processing system, or computer program product. Accordingly, the present invention may take the form of an entirely hardware embodiment, an entirely software embodiment or an embodiment combining software and hardware aspects all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/art specified in the flow chart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 5:
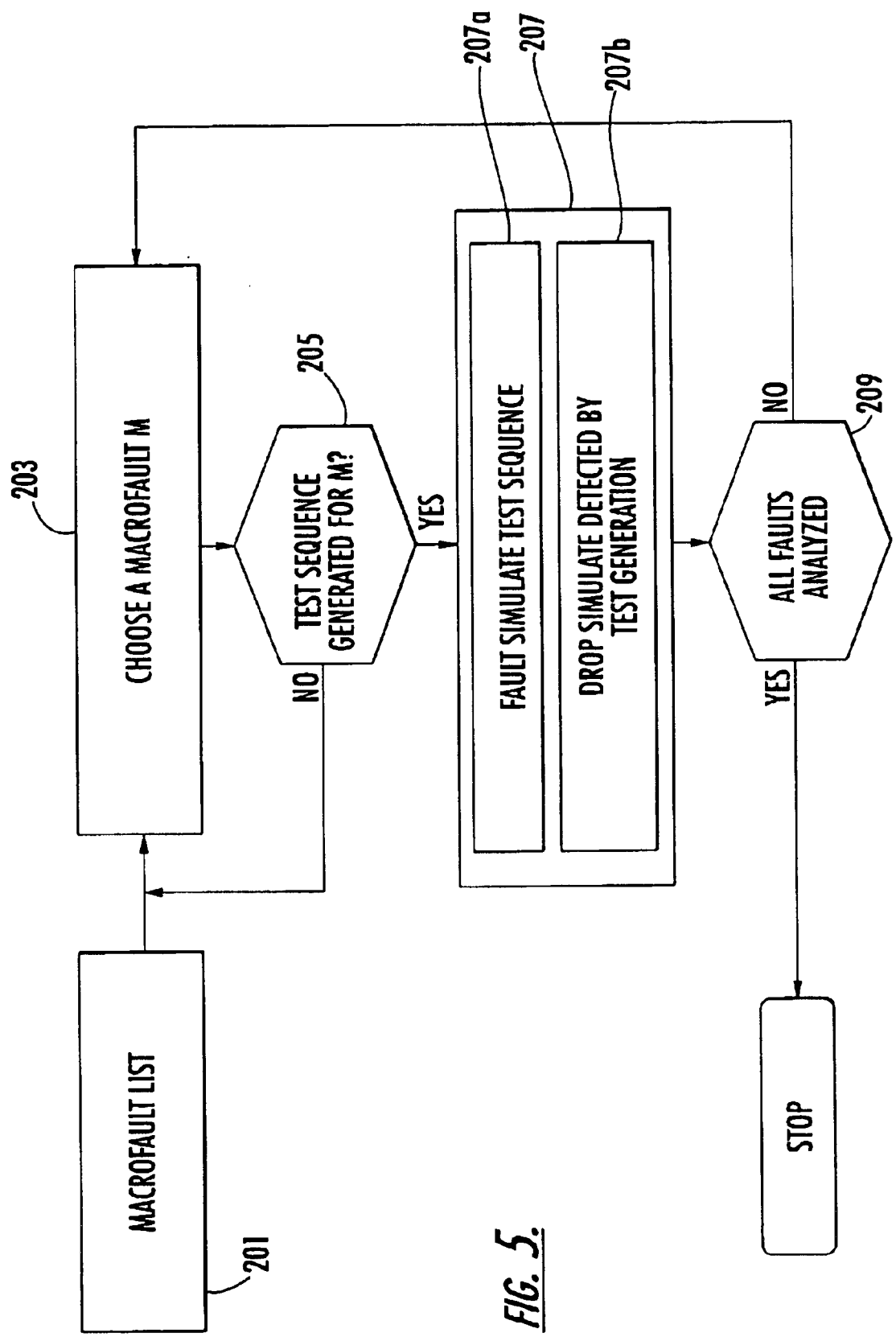
FIGS. 5–7 are flow charts illustrating operations of test generation and simulation according to embodiments of the present invention.

FIG. 5 illustrates operations of test generation and simulation according to embodiments of the present invention wherein test sequences for an electronic device can be generated and/or simulated. When providing test generation and/or simulation, possible faults of interest for the electronic device are selected and modeled as macrofaults comprising one or more fault tuples arranged in one or more products as discussed above in greater detail. The faults of interest may be selected to cover all possible faults or, more likely, subsets of possible faults deemed, for example, most likely to occur and/or most important to test.

As shown at block 201, the macrofaults can be provided as a macrofault list. A macrofault is chosen from the macrofault list at block 203, and the test generator attempts to generate a test sequence comprising one or more test patterns that can detect the fault represented by the macrofault. If a test sequence cannot be generated for the macrofault at block 205, another macrofault is chosen from the macrofault list for test generation at block 203. If a test sequence can be generated for the macrofault at block 205, test simulation can be performed for the test sequence at block 207. Test sequence generation is discussed in greater detail below with respect to FIG. 6.

Once a test sequence is generated for a particular macrofault, the test sequence can be simulated at sub-block 207a to determine if the test sequence can also be used to detect faults represented by other macrofaults in the macrofault list. If the test sequence can be used to detect faults represented by other macrofaults in the macrofault list, these macrofaults can be dropped from the macrofault list at block 207b. Accordingly, the number of separate steps of test sequence generation can be reduced. Moreover, the length of the test (including all test sequences used to detect the faults represented by the macrofaults in the list) can be reduced, by dropping macrofaults from the list that can be detected using previously generated test sequences. Test generation and simulation can be complete at block 209 once all macrofaults from the list have either been subjected to test generation or dropped. Otherwise, the next macrofault from the list can be selected at block 203.

Figure 6:
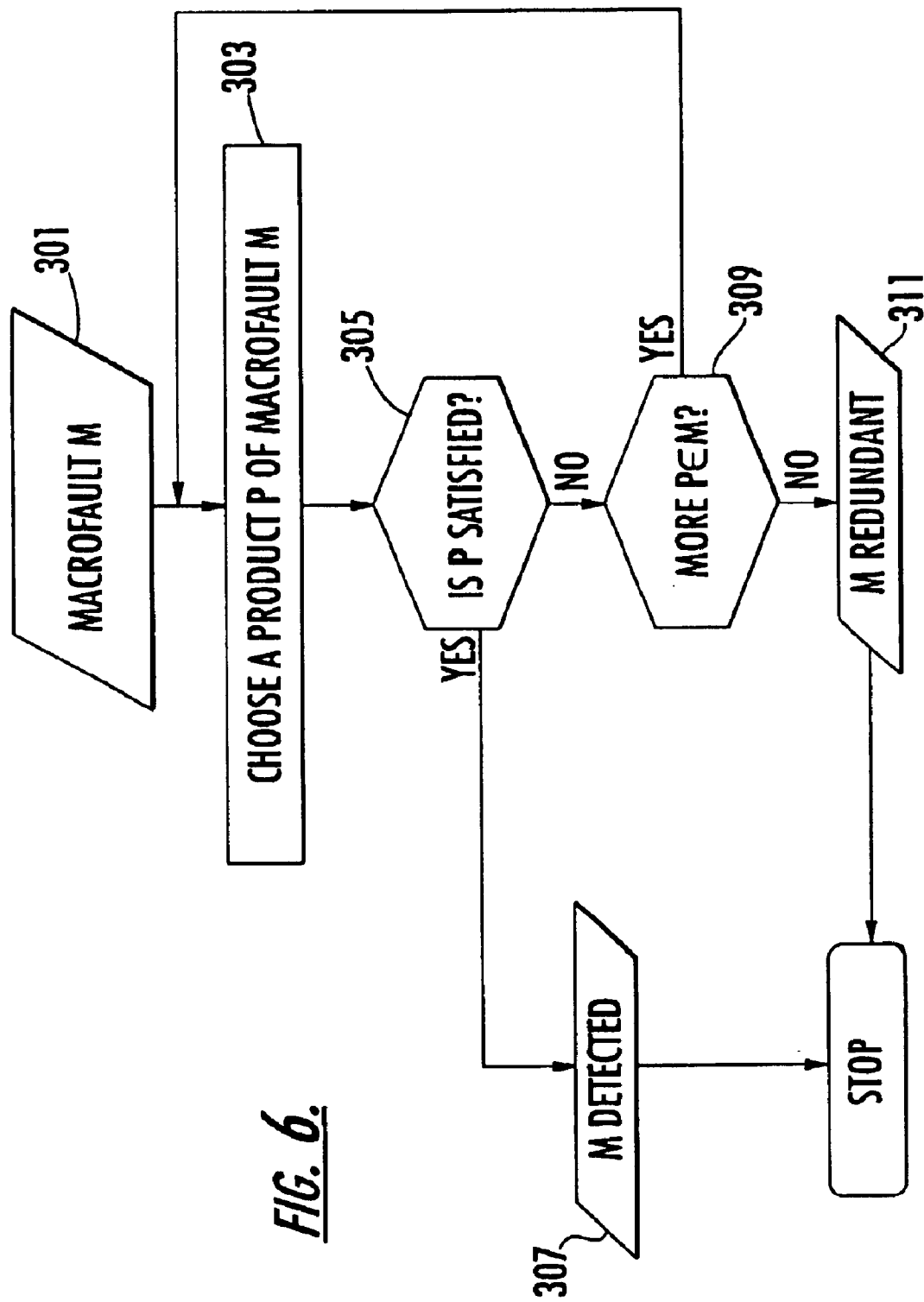

Operations for embodiments of test generation according to the present invention are illustrated in the flow chart of FIG. 6. As shown, a macrofault M can be provided at block 301. The macrofault M comprises at least one fault tuple arranged in one or more products such that each product of fault tuples represents an alternate way of detecting a possible fault of the electronic device. A macrofault with two products P, for example, can be detected by satisfying either or both of the products wherein a product is satisfied by detecting all of the fault tuples thereof and the propagation of one of any resulting errors.

A product P of macrofault M is chosen at block 303 and test sequence generation is attempted for the product P. If a test sequence can be generated that satisfies the product P at block 305, the macrofault M is deemed detected at block 307, and the test sequence is provided for subsequent simulation and/or device testing. If a test sequence cannot be generated that satisfies the product P at block 305, the macrofault is checked at block 309 to determine if there is another product P in the macrofault M. If there are no more products P in the macrofault M, the macrofault is considered redundant at block 311 meaning that a test sequence cannot be generated to detect any of the products of the macrofault M. If there are more products P in the macrofault M, another product P is chosen from the macrofault M at block 303, and test sequence generation is attempted for the new product.

In other words, a test generator according to embodiments of the present invention attempts to generate a test sequence for each product of the macrofault until either a test sequence is generated that satisfies one or more of the products, or none of the products can be satisfied. If none of the products can be satisfied, the macrofault is considered redundant meaning that the test generator is unable to generate a test sequence that satisfies the macrofault.

Figure 7:
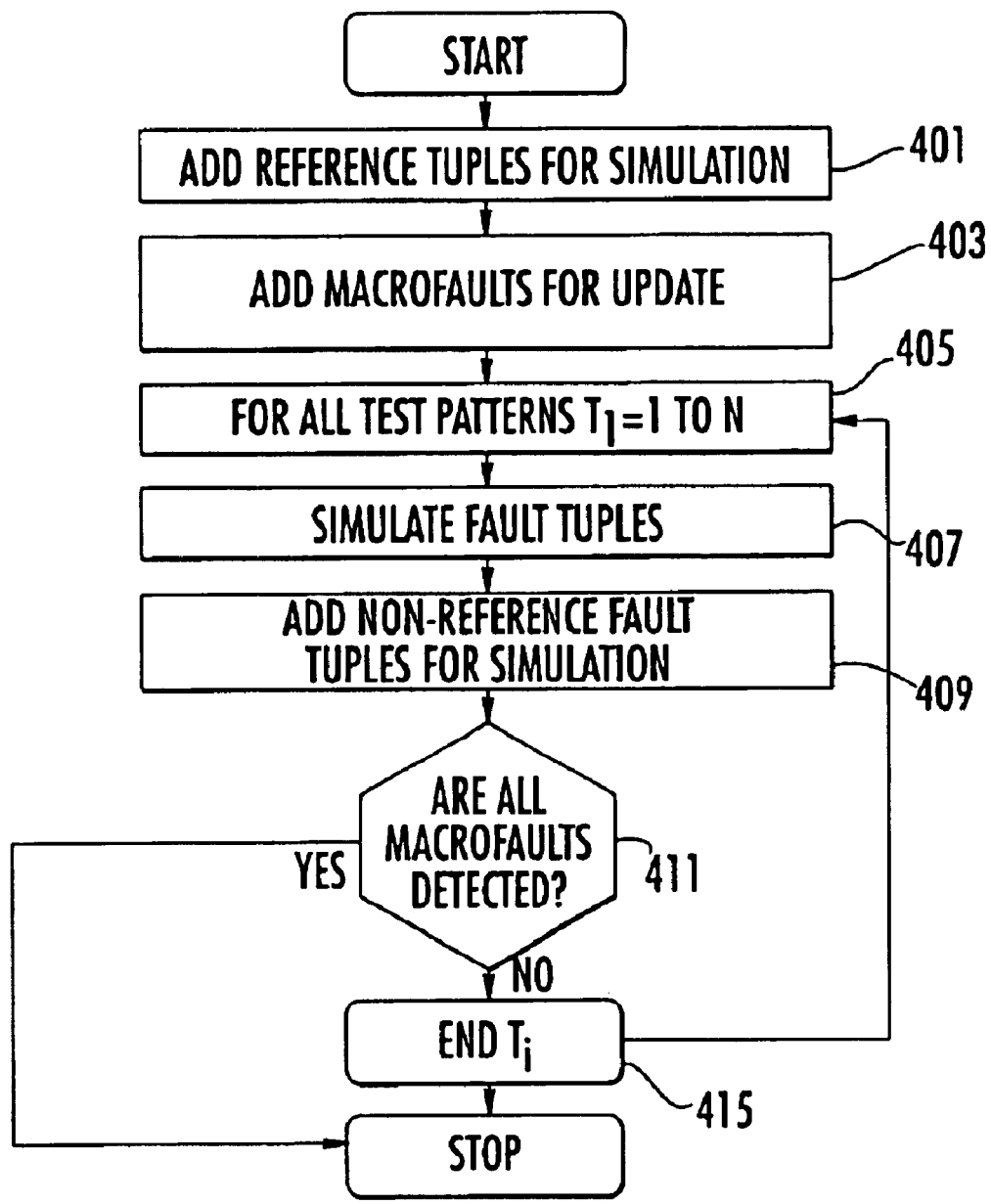

FIG. 7 illustrates operations of test simulation according to the present invention. Once a test sequence has been generated for a macrofault, this test sequence can be simulated for other macrofaults. When doing combined operations of test generation and simulation, simulation can be used to determine if other macrofaults can be detected using a test sequence generated for a first macrofault. Simulation, for example, can be performed for all macrofaults remaining in the macrofault list 201 of FIG. 5. As discussed above, the macrofaults remaining in the macrofault list 201 are the macrofaults which have not been subjected to test generation or have not been dropped during previous simulation operations.

As shown in FIG. 7, the reference tuples of the macrofaults for simulation are added for simulation at block 401. In other words, the test sequence is simulated for all of the reference tuples of all of the macrofaults. If any of the reference tuples cannot be satisfied by the test sequence being simulated, the corresponding macrofaults are not subjected to further simulation. Macrofaults whose reference tuples can be satisfied by the test sequence being simulated can be added for update at block 403. By terminating simulation for macrofaults whose reference tuples are not satisfied by the test sequence being simulated, simulation times can be reduced.

Beginning at block 405, each of the test patterns ($T_i$=1 to N) is simulated until either all of the macrofaults are detected at block 411 or all of the test patterns have been simulated at block 415. For each test pattern, the fault tuples of the macrofaults added at block 403 are simulated at block 407, and non-reference tuples are added for fault simulation at block 409. If all macrofaults added for update at block 403 can be detected using the test patterns simulated so far, simulation can end at block 411, or simulation can end when all of the test patterns have been simulated at block 415. Alternately, simulation can proceed with the next test pattern at block 405. At the end of simulation, there will be provided a listing of macrofaults satisfied by the test sequence being simulated (if any of the macrofaults are satisfied by the test sequence being simulated).

When simulation is integrated with test generation as shown in FIG. 10, the macrofaults satisfied by the test sequence being simulated can be dropped at block 207b from the macrofault list of block 201. Accordingly, a number of test sequences generated can be reduced because separate test sequences do not need to be generated for the macrofaults dropped because they were satisfied by previously generated test sequences.

While test generation and simulation are discussed with regard to FIG. 5 as being combined, test generation according to FIG. 6 and test simulation according to FIG. 7 can be performed separately. For example, embodiments of test generation according to the present invention can be performed for one or more macrofaults without test simulation. Alternately, embodiments of test simulation according to the present invention can be performed for test sequences generated according to any means know to those having skill in the art.

In the drawings and specification, there have been disclosed typical preferred embodiments of the invention and, although specific terms are employed, they are used in a generic and descriptive sense only and not for purposes of limitation, the scope of the invention being set forth in the following claims. The use of fault tuples is also discussed by K. N. Dwarakanath and R. D. Blanton in "Universal Fault Simulation Using Fault Tuples" (Proceedings of the 37$^{th}$ Design Automation Conference, pp. 786–789, June 2000); and by R. Desineni, K. N. Dwarakanath, and R. D. Blanton in "Universal Test Generation Using Fault Tuples" (ITC International Test Conference, pp. 812–819, October 2000). The inventor of the present invention is an author of each of these publications which were published less than one year prior to the filing of the present application. The disclosures of these publications are hereby incorporated by reference herein in their entirety.

What is claimed is:

1. A method for characterizing a fault in an integrated circuit device, the integrated circuit device comprising primary inputs, primary outputs, and a plurality of signal lines and circuits interconnecting the primary inputs and outputs, the method comprising:

defining a fault tuple including an identification of a signal line, a signal line value, and a clock cycle constraint for the signal line such that the fault tuple is satisfied by providing a test sequence comprising one or more test patterns such that the signal line is controlled to the signal line value during a clock cycle of the test sequence defined by the clock cycle constraint responsive to application of the test sequence to the primary inputs wherein the signal line identified by the fault tuple is not directly coupled to any of the primary inputs and wherein the signal line is not directly coupled to any of the primary outputs.

2. A method for characterizing a fault in an integrated circuit device, the integrated circuit device comprising primary inputs, primary outputs, and a plurality of signal lines and circuits interconnecting the primary inputs and outputs, the method comprising:

defining a fault tuple including an identification of a signal line, a signal line value, and a clock cycle constraint for the signal line such that the fault tuple is satisfied by providing a test sequence comprising one or more test patterns such that the signal line is controlled to the signal line value during a clock cycle of the test sequence defined by the clock cycle constraint responsive to application of the test sequence to the primary inputs; and defining a second fault tuple including an identification of a second signal line, a second signal line value, and a second clock cycle constraint for the second signal line such that a product of fault tuples includes the first and second fault tuples wherein the product of fault tuples is satisfied by providing the test sequence comprising one or more test patterns such that each of the signal lines of each of the fault tuples is controlled to the respective signal line values during clock cycles of the test sequence defined by the respective clock cycle constraints responsive to application of the test sequence to the primary inputs.

3. A method according to claim 2 wherein at least one of the first and second signal line values comprises an error discrepancy wherein the product is detected when each fault tuple of the product is satisfied by providing the test sequence and the error discrepancy is observable at a primary output.

4. A method according to claim 3 further comprising:

defining third and fourth fault tuples such that a second product of the third and fourth fault tuples is satisfied by providing a second test sequence comprising one or more test patterns wherein a macrofault comprising the first and second products can be detected when either the first product or the second product is satisfied and a resulting error discrepancy is observable at a primary output.

5. A method according to claim 2 further comprising:

generating a test sequence comprising a plurality of test patterns wherein the test sequence satisfies the first and second fault tuples of the product and wherein at least one of the first and second signal line values comprises an error discrepancy and wherein the error discrepancy is observable at a primary output in response to application of the test sequence to the primary inputs.

6. A method according to claim 5 further comprising:

determining if the test sequence satisfies a second product of fault tuples representing a second fault to be characterized.

7. A method according to claim 2 further comprising:

providing a test sequence comprising a plurality of test patterns; and determining if the test sequence satisfies the product including the first and second fault tuples.

8. A method according to claim 2 wherein the second clock cycle constraint is related to the first clock cycle constraint by an arithmetic or relational operator.

9. A method according to claim 8 wherein the first fault tuple comprises a reference tuple.

10. A method of generating test patterns for an integrated circuit device, the integrated circuit comprising primary inputs, primary outputs, and a plurality of signal lines and circuits interconnecting the primary inputs and outputs, said method comprising:

providing at least one fault tuple including an identification of a signal line, a signal line value, and a clock cycle constraint for the signal line, wherein the signal line identified by the fault tuple is not directly coupled to any of the primary inputs and wherein the signal line is not directly coupled to any of the primary outputs; and determining a test sequence comprising at least one test pattern that can be applied to the primary inputs of the integrated circuit device to control the signal line to the signal line value during a clock cycle of the test sequence defined by the clock cycle constraint.

11. A method of generating test patterns for an integrated circuit device, the integrated circuit comprising primary inputs, primary outputs, and a plurality of signal lines and circuits interconnecting the primary inputs and outputs, said method comprising:

providing at least one fault tuple including an identification of a signal line, a signal line value, and a clock cycle constraint for the signal line; and determining a test sequence comprising at least one test pattern that can be applied to the primary inputs of the integrated circuit device to control the signal line to the signal line value during a clock cycle of the test sequence defined by the clock cycle constraint;

wherein providing at least one fault tuple further comprises defining a second fault tuple including a second identification of a signal line, a second signal line value, and a second clock cycle constraint for the second signal line wherein a product comprises the first and second fault tuples; and wherein determining a test sequence further comprises determining a test sequence that can be applied to the primary inputs of the integrated circuit device to control the first signal line to the first signal line value during the first clock cycle of the test sequence defined by the first clock cycle constraint and to control the second signal line to the second signal line value during a second clock cycle of the test sequence defined by the second clock cycle constraint.

12. A method according to claim 11 wherein at least one of the first and second signal line values comprises an error discrepancy wherein determining the test sequence further comprises determining if the test sequence can manifest the error discrepancy at a primary output.

13. A method according to claim 12 further comprising:
providing third and fourth fault tuples of a second product of fault tuples; and
wherein if the test sequence cannot manifest the error discrepancy at a primary output, determining a second test sequence that can be applied to the primary inputs of the integrated circuit device to satisfy the third and fourth fault tuples.

14. A method according to claim 11 further comprising:
determining if the test sequence satisfies a second product of fault tuples representing a second fault to be characterized.

15. A method according to claim 11 wherein the second clock cycle constraint is related to the first clock cycle constraint by an arithmetic or relational operator.

16. A method according to claim 15 wherein the first fault tuple comprises a reference tuple.

17. A method of simulating a test pattern for an integrated circuit device, the integrated circuit device comprising primary inputs, primary outputs, and a plurality of signal lines and circuits interconnecting the primary inputs and outputs, the method comprising:
providing a fault tuple including an identification of a signal line, a signal line value, and a clock cycle constraint for the signal line, wherein the signal line identified by the fault tuple is not directly coupled to any of the primary inputs and wherein the signal line is not directly coupled to any of the primary outputs;
providing a test sequence comprising one or more test patterns; and
determining if the fault tuple will be satisfied by the test sequence such that the signal line is controlled to the signal line value during a clock cycle of the test sequence defined by the clock cycle constraint responsive to application of the test sequence to the primary inputs.

18. A method of simulating a test pattern for an integrated circuit device, the integrated circuit device comprising primary inputs, primary outputs, and a plurality of signal lines and circuits interconnecting the primary inputs and outputs, the method comprising:
providing a fault tuple including an identification of a signal line, a signal line value, and a clock cycle constraint for the signal line;
providing a test sequence comprising one or more test patterns;
determining if the fault tuple will be satisfied by the test sequence such that the signal line is controlled to the signal line value during a clock cycle of the test sequence defined by the clock cycle constraint responsive to application of the test sequence to the primary inputs;
providing a second fault tuple including an identification of a second signal line, a second signal line value, and a second clock cycle constraint for the second signal line such that a product of fault tuples includes the first and second fault tuples; and
determining if the second fault tuple will be satisfied by the test sequence such that the second signal lines is controlled to the second signal line value during a clock cycle of the test sequence defined by the second clock cycle constraint responsive to application of the test sequence to the primary inputs.

19. A method according to claim 18 wherein at least one of the first and second signal line values comprises an error discrepancy, the method further comprising:
determining if the error discrepancy will be observable at a primary output responsive to application of the test sequence to the primary inputs.

20. A method according to claim 18 further comprising:
if the first and second fault tuples will not be satisfied by the test sequence or if the error discrepancy will not be not be observable at a primary output, generating a second test sequence comprising a plurality of test patterns wherein the test sequence satisfies the first and second fault tuples of the product and wherein at least one of the first and second signal line values comprises an error discrepancy and wherein the error discrepancy is observable at a primary output in response to application of the second test sequence to the primary inputs.

21. A method according to claim 20 further comprising:
determining if the second test sequence satisfies a second product of fault tuples representing a second fault to be characterized.

22. A method according to claim 18 wherein the second clock cycle constraint is related to the first clock cycle constraint by an arithmetic or relational operator.

23. A method according to claim 22 wherein the first fault tuple comprises a reference tuple.

24. A system for generating test patterns for an integrated circuit device, the integrated circuit comprising primary inputs, primary outputs, and a plurality of signal lines and circuits interconnecting the primary inputs and outputs, said system comprising:
means for providing at least one fault tuple including an identification of a signal line, a signal line value, and a clock cycle constraint for the signal line, wherein the signal line identified by the fault tuple is not directly coupled to any of the primary inputs and wherein the signal line is not directly coupled to any of the primary outputs; and
means for determining a test sequence comprising at least one test pattern that can be applied to the primary inputs of the integrated circuit device to control the signal line to the signal line value during a clock cycle of the test sequence defined by the clock cycle constraint.

25. A system for generating test patterns for an integrated circuit device, the integrated circuit comprising primary inputs, primary outputs, and a plurality of signal lines and circuits interconnecting the primary inputs and outputs, said system comprising:
means for providing at least one fault tuple including an identification of a signal line, a signal line value, and a clock cycle constraint for the signal line; and
means for determining a test sequence comprising at least one test pattern that can be applied to the primary inputs of the integrated circuit device to control the signal line to the signal line value during a clock cycle of the test sequence defined by the clock cycle constraint;
wherein said means for providing at least one fault tuple further comprises means for defining a second fault tuple including a second identification of a signal line, a second signal line value, and a second clock cycle constraint for the second signal line wherein a product comprises the first and second fault tuples; and wherein said means for determining a test sequence further comprises means for determining a test sequence that can be applied to the primary inputs of the integrated circuit device to control the first signal line to the first signal line value during the first clock cycle of the test sequence defined by the first clock cycle constraint and to control the second signal line to the second signal line value during a second clock cycle of the test sequence defined by the second clock cycle constraint.

26. A system according to claim 25 wherein at least one of the first and second signal line values comprises an error discrepancy wherein said means for determining the test sequence further comprises means for determining if the test sequence can manifest the error discrepancy at a primary output.

27. A system according to claim 26 further comprising:
means for providing third and fourth fault tuples of a second product of fault tuples; and
means for determining a second test sequence that can be applied to the primary inputs of the integrated circuit device to satisfy the third and fourth fault tuples if the test sequence cannot manifest the error discrepancy at a primary output.

28. A system according to claim 25 further comprising:
means for determining if the test sequence satisfies a second product of fault tuples representing a second fault to be characterized.

29. A system according to claim 25 wherein the second clock cycle constraint is related to the first clock cycle constraint by an arithmetic or relational operator.

30. A system according to claim 29 wherein the first fault tuple comprises a reference tuple.

31. A system for simulating a test pattern for an integrated circuit device, the integrated circuit device comprising primary inputs, primary outputs, and a plurality of signal lines and circuits interconnecting the primary inputs and outputs, the system comprising:
means for providing a fault tuple including an identification of a signal line, a signal line value, and a clock cycle constraint for the signal line, wherein the signal line identified by the fault tuple is not directly coupled to any of the primary inputs and wherein the signal line is not directly coupled to any of the primary outputs;
means for providing a test sequence comprising one or more test patterns; and
means for determining if the fault tuple will be satisfied by the test sequence such that the signal line is controlled to the signal line value during a clock cycle of the test sequence defined by the clock cycle constraint responsive to application of the test sequence to the primary inputs.

32. A system for simulating a test pattern for an integrated circuit device, the integrated circuit device comprising primary inputs, primary outputs, and a plurality of signal lines and circuits interconnecting the primary inputs and outputs, the system comprising:
means for providing a fault tuple including an identification of a signal line, a signal line value, and a clock cycle constraint for the signal line;
means for providing a test sequence comprising one or more test patterns; and
means for determining if the fault tuple will be satisfied by the test sequence such that the signal line is controlled to the signal line value during a clock cycle of the test sequence defined by the clock cycle constraint responsive to application of the test sequence to the primary inputs;
means for providing a second fault tuple including an identification of a second signal line, a second signal line value, and a second clock cycle constraint for the second signal line such that a product of fault tuples includes the first and second fault tuples; and
means for determining if the second fault tuple will be satisfied by the test sequence such that the second signal lines is controlled to the second signal line value during a clock cycle of the test sequence defined by the second clock cycle constraint responsive to application of the test sequence to the primary inputs.

33. A system according to claim 32 wherein at least one of the first and second signal line values comprises an error discrepancy, the system further comprising:
means for determining if the error discrepancy will be observable at a primary output responsive to application of the test sequence to the primary inputs.

34. A system according to claim 32 further comprising:
means for generating a second test sequence if the first and second fault tuples will not be satisfied by the first test sequence or if the error discrepancy will not be not be observable at a primary output, the second test sequence comprising a plurality of test patterns wherein the second test sequence satisfies the first and second fault tuples of the product and wherein at least one of the first and second signal line values comprises an error discrepancy and wherein the error discrepancy is observable at a primary output in response to application of the second test sequence to the primary inputs.

35. A system according to claim 34 further comprising:
means for determining if the second test sequence satisfies a second product of fault tuples representing a second fault to be characterized.

36. A system according to claim 32 wherein the second clock cycle constraint is related to the first clock cycle constraint by an arithmetic or relational operator.

37. A system according to claim 36 wherein the first fault tuple comprises a reference tuple.

38. A computer program product for generating test patterns for an integrated circuit device, the integrated circuit comprising primary inputs, primary outputs, and a plurality of signal lines and circuits interconnecting the primary inputs and outputs, the computer program product comprising a computer-readable storage medium having computer-readable program code embodied in the medium, the computer-readable program code comprising:
computer-readable program code that provides at least one fault tuple including an identification of a signal line, a signal line value, and a clock cycle constraint for the signal line, wherein the signal line identified by the fault tuple is not directly coupled to any of the primary inputs and wherein the signal line is not directly coupled to any of the primary outputs; and
computer-readable program code that determines a test sequence comprising at least one test pattern that can be applied to the primary inputs of the integrated circuit device to control the signal line to the signal line value during a clock cycle of the test sequence defined by the clock cycle constraint.

39. A computer program product for generating test patterns for an integrated circuit device, the integrated circuit comprising primary inputs, primary outputs, and a plurality of signal lines and circuits interconnecting the primary inputs and outputs, the computer program product comprising a computer-readable storage medium having computer-readable program code embodied in the medium, the computer-readable program code comprising:

computer-readable program code that provides at least one fault tuple including an identification of a signal line, a signal line value, and a clock cycle constraint for the signal line;

computer-readable program code that determines a test sequence comprising at least one test pattern that can be applied to the primary inputs of the integrated circuit device to control the signal line to the signal line value during a clock cycle of the test sequence defined by the clock cycle constraint;

wherein the computer-readable program code that provides at least one fault tuple further provides a second fault tuple including a second identification of a signal line, a second signal line value, and a second clock cycle constraint for the second signal line wherein a product comprises the first and second fault tuples; and wherein the computer-readable program code that determines a test sequence further determines a test sequence that can be applied to the primary inputs of the integrated circuit device to control the first signal line to the first signal line value during the first clock cycle of the test sequence defined by the first clock cycle constraint and to control the second signal line to the second signal line value during a second clock cycle of the test sequence defined by the second clock cycle constraint.

40. A computer program product according to claim 39 wherein at least one of the first and second signal line values comprises an error discrepancy wherein the computer-readable program code that determines the test sequence further determines if the test sequence can manifest the error discrepancy at a primary output.

41. A computer program product according to claim 40 further comprising:

computer-readable program code that provides third and fourth fault tuples of a second product of fault tuples; and computer-readable program code that determines a second test sequence that can be applied to the primary inputs of the integrated circuit device to satisfy the third and fourth fault tuples if the first test sequence cannot manifest the error discrepancy at a primary output.

42. A computer program product according to claim 39 further comprising:

computer-readable program code that determines if the test sequence satisfies a second product of fault tuples representing a second fault to be characterized.

43. A computer program product according to claim 39 wherein the second clock cycle constraint is related to the first clock cycle constraint by an arithmetic or relational operator.

44. A computer program product according to claim 43 wherein the first fault tuple comprises a reference tuple.

45. A computer program product for simulating a test pattern for an integrated circuit device, the integrated circuit device comprising primary inputs, primary outputs, and a plurality of signal lines and circuits interconnecting the primary inputs and outputs, the computer program product comprising a computer-readable storage medium having computer-readable program code embodied in the medium, the computer-readable program code comprising:

computer-readable program code that provides a fault tuple including an identification of a signal line, a signal line value, and a clock cycle constraint for the signal line, wherein the signal line identified by the fault tuple is not directly coupled to any of the primary inputs and wherein the signal line is not directly coupled to any of the primary outputs;

computer-readable program code that provides a test sequence comprising one or more test patterns; and computer-readable program code that determines if the fault tuple will be satisfied by the test sequence such that the signal line is controlled to the signal line value during a clock cycle of the test sequence defined by the clock cycle constraint responsive to application of the test sequence to the primary inputs.

46. A computer program product for simulating a test pattern for an integrated circuit device, the integrated circuit device comprising primary inputs, primary outputs, and a plurality of signal lines and circuits interconnecting the primary inputs and outputs, the computer program product comprising a computer-readable storage medium having computer-readable program code embodied in the medium, the computer-readable program code comprising:

computer-readable program code that provides a fault tuple including an identification of a signal line, a signal line value, and a clock cycle constraint for the signal line;

computer-readable program code that provides a test sequence comprising one or more test patterns;

computer-readable program code that determines if the fault tuple will be satisfied by the test sequence such that the signal line is controlled to the signal line value during a clock cycle of the test sequence defined by the clock cycle constraint responsive to application of the test sequence to the primary inputs computer-readable program code that provides a second fault tuple including an identification of a second signal line, a second signal line value, and a second clock cycle constraint for the second signal line such that a product of fault tuples includes the first and second fault tuples; and computer-readable program code that determines if the second fault tuple will be satisfied by the test sequence such that the second signal lines is controlled to the second signal line value during a clock cycle of the test sequence defined by the second clock cycle constraint responsive to application of the test sequence to the primary inputs.

47. A computer program product according to claim 46 wherein at least one of the first and second signal line values comprises an error discrepancy, the computer program product further comprising:

computer-readable program code that determines if the error discrepancy will be observable at a primary output responsive to application of the test sequence to the primary inputs.

48. A computer program product according to claim 46 further comprising:

computer-readable program code that generates a second test sequence if the first and second fault tuples will not be satisfied by the test sequence or if the error discrepancy will not be not be observable at a primary output, the second test sequence comprising a plurality of test patterns wherein the test sequence satisfies the first and second fault tuples of the product and wherein at least one of the first and second signal line values comprises an error discrepancy and wherein the error discrepancy is observable at a primary output in response to application of the second test sequence to the primary inputs.

49. A computer program product according to claim 48 further comprising:

computer-readable program code that determines if the second test sequence satisfies a second product of fault tuples representing a second fault to be characterized.

50. A computer program product according to claim 46 wherein the second clock cycle constraint is related to the first clock cycle constraint by an arithmetic or relational operator.

51. A computer program product according to claim 50 wherein the first fault tuple comprises a reference tuple.

52. A method of generating test patterns for an integrated circuit device, the integrated circuit device comprising primary inputs, primary outputs, and a plurality of signal lines and circuits interconnecting the primary inputs and outputs, said method comprising:

providing a list of a plurality of macrofaults each representing a respective possible fault condition of the integrated circuit device;

generating a first test sequence that can detect a first macrofault from the list;

simulating the first test sequence for macrofaults from the list to determine if any other macrofaults from the list can be detected using the first test sequence;

dropping any macrofaults from the list that can be detected using the first test sequence; and generating a second test sequence that can detect a second macrofault from the list of remaining macrofaults.

53. A method according to claim 52 wherein generating the first test sequence alternately comprises determining if a test sequence cannot be generated to detect the first macrofault, wherein simulating the first test sequence is omitted when a test sequence cannot be generated, and wherein dropping any macro faults comprises dropping the macrofault for which a test sequence cannot be generated.

54. A method according to claim 53 wherein operations of generating, simulating, and dropping are repeated until all macrofaults have been dropped from the list.

55. A method according to claim 53 wherein generating a first test sequence that can detect a first macrofault from the list comprises selecting the first macrofault from the list according to a heuristics based order.

56. A method according to claim 1 wherein the signal line comprises a portion of a path between at least one of the primary inputs and at least one of the primary outputs, wherein the path includes at least one circuit coupled between the signal line and the at least one primary input of the path, and wherein the path includes at least one circuit coupled between the signal line and the at least one primary output of the path.

57. A method according to claim 10 wherein the signal line comprises a portion of a path between at least one of the primary inputs and at least one of the primary outputs, wherein the path includes at least one circuit coupled between the signal line and the at least one primary input of the path, and wherein the path includes at least one circuit coupled between the signal line and the at least one primary output of the path.

58. A method according to claim 17 wherein the signal line comprises a portion of a path between at least one of the primary inputs and at least one of the primary outputs, wherein the path includes at least one circuit coupled between the signal line and the at least one primary input of the path, and wherein the path includes at least one circuit coupled between the signal line and the at least one primary output of the path.

59. A system according to claim 24 wherein the signal line comprises a portion of a path between at least one of the primary inputs and at least one of the primary outputs, wherein the path includes at least one circuit coupled between the signal line and the at least one primary input of the path, and wherein the path includes at least one circuit coupled between the signal line and the at least one primary output of the path.

60. A system according to claim 31 wherein the signal line comprises a position of a path between at least one of the primary inputs and at least one of the primary outputs, wherein the path includes at least one circuit coupled between the signal line and the at least one primary input of the path, and wherein the path includes at least one circuit coupled between the signal line and the at least one primary output of the path.

61. A computer program product according to claim 38 wherein the signal line comprises a portion of a path between at least one of the primary inputs and at least one of the primary outputs, wherein the path includes at least one circuit coupled between the signal line and the at least one primary input of the path, and wherein the path includes at least one circuit coupled between the signal line and the at least one primary output of the path.

62. A computer program product according to claim 45 wherein the signal line comprises a portion of a path between at least one of the primary inputs and at least one of the primary outputs, wherein the path includes at least one circuit coupled between the signal line and the at least one primary input of the path, and wherein the path includes at least one circuit coupled between the signal line and the at least one primary output of the path.

* * * * *